United States Patent
Nakaya et al.

(10) Patent No.: US 6,944,203 B2
(45) Date of Patent: Sep. 13, 2005

(54) MULTIMODE LIGHT GENERATING MODULE, SEMICONDUCTOR LASER APPARATUS, AND OPTICAL FIBER AMPLIFIER

(75) Inventors: Hiroyuki Nakaya, Yokohama (JP); Goro Sasaki, Yokohama (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 214 days.

(21) Appl. No.: 10/410,178

(22) Filed: Apr. 10, 2003

(65) Prior Publication Data

US 2003/0210729 A1 Nov. 13, 2003

Related U.S. Application Data

(60) Provisional application No. 60/378,371, filed on May 8, 2002.

(51) Int. Cl.[7] .................................................. H01S 3/08
(52) U.S. Cl. ............................ 372/102; 372/6; 372/109; 385/88
(58) Field of Search ............................. 372/6, 102, 109; 385/88

(56) References Cited

U.S. PATENT DOCUMENTS 5,845,030 A * 12/1998 Sasaki et al. ................. 385/88
5,993,073 A * 11/1999 Hamakawa et al. .......... 385/88
6,647,038 B2 * 11/2003 Althaus et al. ............... 372/36
2003/0067952 A1 * 4/2003 Tsukiji et al. ................. 372/36
2004/0213304 A1 * 10/2004 Zemmouri et al. ........... 372/32

FOREIGN PATENT DOCUMENTS

| JP | P2001-185807 A | 7/2001 | |
| JP | 2001-185807 | * 6/2004 | ............. H01S/5/14 |

* cited by examiner

*Primary Examiner*—Don Wong
*Assistant Examiner*—Leith Al-Nazer
(74) *Attorney, Agent, or Firm*—McDermott Will & Emery LLP

(57) ABSTRACT

A multimode light generating module comprises an optical cavity and a light-receiving element. The optical cavity is constituted by a semiconductor optical amplification element, and an optical fiber having a grating. The optical fiber comprises a grating having an apodized periodic refractive index distribution, and the slope of the reflection spectrum in a longer wavelength region with respect to the peak wavelength $\lambda_p$ is gentler than that in the shorter wavelength region therewith. The grating satisfies the relationship of 0.5 nm>$\lambda_{0.2}-\lambda_p$>0.1 nm. Here, $\lambda_{0.2}$ is defined by $\lambda_{0.2}^h - \lambda_{0.2}^l$, where $\lambda_{0.2}^h$ is the longer one of two wavelengths exhibiting a relative reflectivity of 0.2 with respect to the maximum reflectivity, and $\lambda_{0.2}^l$ is the shorter one of two wavelengths exhibiting a relative reflectivity of 0.2 with respect to the maximum reflectivity.

25 Claims, 9 Drawing Sheets

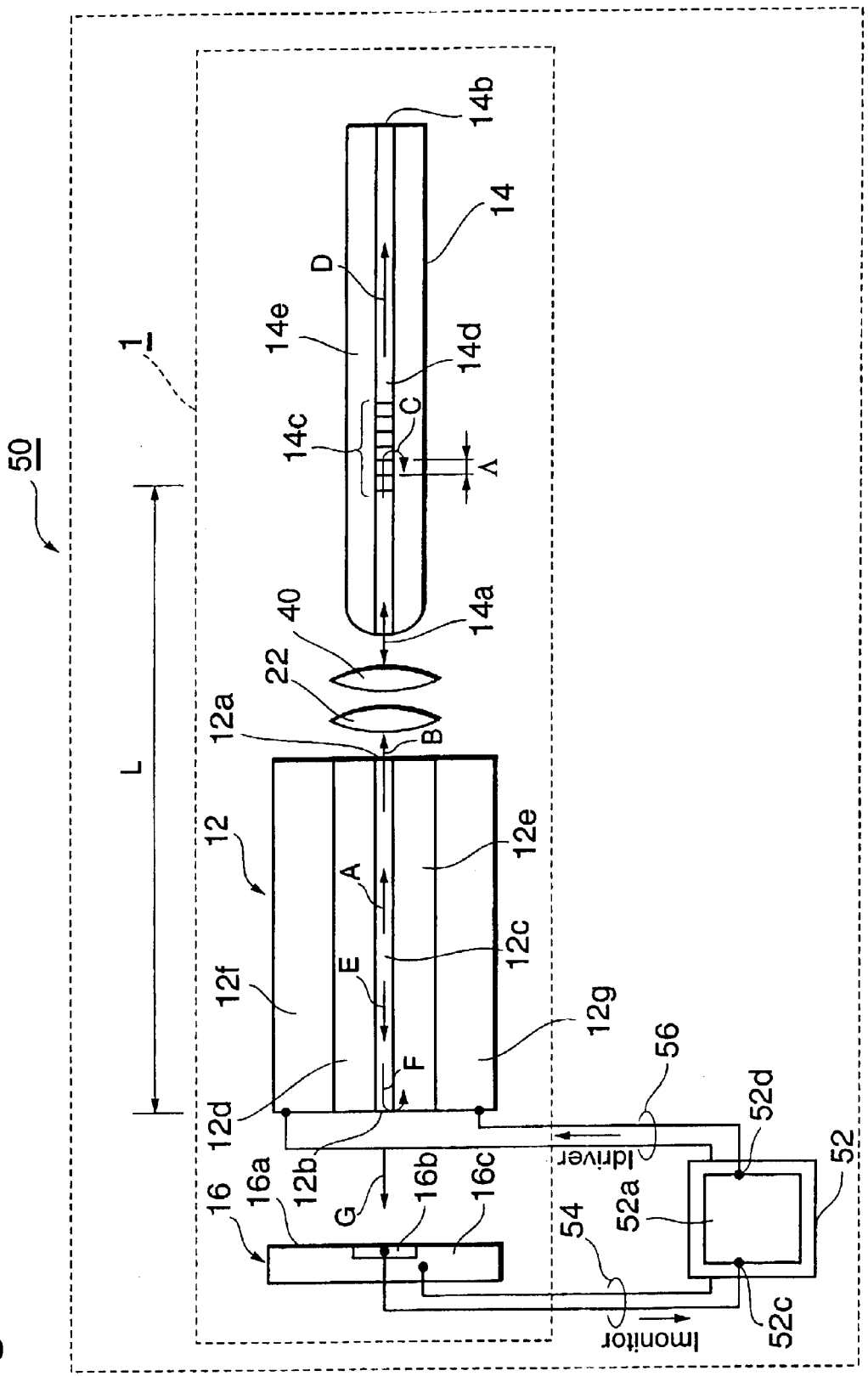

MULTIMODE LIGHT GENERATING MODULE, SEMICONDUCTOR LASER APPARATUS, AND OPTICAL FIBER AMPLIFIER

CROSS-REFERENCE TO RELATED APPLICATIONS

This application claims the benefit of the claiming priority of U.S. Provisional application Ser. No. 60/378,371, filed on May 8, 2002, which provisional application is incorporated by reference herein.

BACKGROUND OF THE INVENTION

1. Field of the Invention

The present invention relates to a multimode light generating module, and a semiconductor laser apparatus and optical fiber amplifier utilizing the multimode light generating module.

2. Related Background Art

Light-generating modules fall into two categories: multimode light generating modules; single-mode light generating modules. One type of multimode light generating modules comprises a Fabry-Perot type semiconductor laser used in the wavelength band of 1.48 $\mu$m. Another type of multimode light generating modules comprises an optical fiber having a grating, and a semiconductor optical amplification element. In these light-generating modules, a monitor light-receiving element is used for controlling the optical output of the semiconductor laser element or semiconductor optical amplification element. In order to obtain a large optical output in these light-generating modules, a large amount of current is injected into the semiconductor laser element or semiconductor optical amplification element.

SUMMARY OF THE INVENTION

In a multimode light generating modules whose optical fiber grating has a relatively narrower reflection bandwidth, the temperature of the semiconductor laser element or semiconductor optical module or current injected thereto is fluctuated. This fluctuation changes oscillating longitudinal modes of laser oscillation. The change in the longitudinal modes fluctuates an amount of monitoring current from the monitor light-receiving element. By way of the feedback path, this current fluctuation changes driving current applied to the semiconductor optical amplification element. The change in driving current may cause further changes the longitudinal modes, thereby varying the optical output of the semiconductor laser or semiconductor optical amplification element.

Therefore, it is an object of the present invention to provide a multimode light generating module capable of reducing fluctuations in the monitor current of the monitor light-receiving element, and a semiconductor laser apparatus and optical fiber amplifier including this multimode light generating module.

The multimode light generating module in accordance with one aspect of the present invention comprises an optical cavity and a light-receiving element. The optical cavity is constituted by a semiconductor optical amplification element and an optical fiber having a grating. The light-receiving element is optically coupled to the optical cavity. The semiconductor optical amplification element has a pair of end faces. The optical fiber has one end portion optically coupled to one end face of the end faces of the semiconductor optical amplification element, and a grating having an apodized periodic distribution of refractive index.

The grating has an asymmetrical reflection spectrum exhibiting the relationship of 0.5 nm>$\lambda_{0.2}-\lambda_p$>0.1 nm. Here, $\lambda_p$ is the wavelength having the maximum reflectivity, and $\lambda_{0.2}$ is defined by $\lambda_{0.2}{}^h-\lambda_{0.2}{}^l$, where $\lambda_{0.2}{}^h$ is the longer one of the two wavelengths exhibiting a relative reflectivity of 0.2 with respect to the maximum reflectivity, and $\lambda_{0.2}{}^l$ is the shorter one of the two wavelengths.

Since the reflection spectrum of the grating satisfies the relationship of 0.5 nm>$\lambda_{0.2}-\lambda_p$>0.1 nm, the slope of the reflection spectrum in a longer wavelength region with respect to the peak wavelength $\lambda_p$ is gentler than that in the shorter wavelength region therewith. The inventors think that ripples may appear in reflection spectrums exhibiting the relationship of $\lambda_{0.2}-\lambda_p$ of 0.5 nm or greater. In reflection spectrums satisfying the relationship of $\lambda_{0.2}-\lambda_p$>0.1 nm, changes in the monitor current from the monitor light-receiving element become less sensitive to the changes of the longitudinal modes of laser oscillation in the semiconductor optical amplification element (mode hopping). Hence, the light generating module can reduce the occurrence of kinks in the driving current vs. monitor current characteristic (monitor current characteristic).

Another aspect of the present invention is a semiconductor laser apparatus for optical pumping. The semiconductor laser apparatus comprises a plurality of multimode light generating modules, control means, and optical multiplexing means.

The multimode light generating module for the semiconductor laser apparatus can have any of the configurations as explained above or those explained hereinafter. The control means is connected between the light-receiving element and semiconductor optical amplification element in each multimode light generating module, and operates to feedback-control the semiconductor optical amplification element, e.g., a driving current thereof, in response to an electric signal from the light-receiving element. The optical multiplexing means has an output and inputs, multiplexes the light received at each input, and provides the output with thus multiplexed light. The input is optically coupled to one of the multimode light generating modules, whereas the output is provided as to be optically connectable to an optical fiber amplifier, for example.

The semiconductor laser apparatus can reduce the occurrence of kinks in its monitor current characteristic.

Still another aspect of the present invention is an optical fiber amplifier. The optical fiber amplifier comprises an erbium-doped optical fiber, a first multimode light generating module, and control means. The erbium-doped optical fiber has one end portion and another end portion. The first multimode light generating module is optically coupled to one end portion of the erbium-doped optical fiber. The multimode light generating module can be any of the configurations as explained above or those explained hereinafter. The control means can use the configurations as explained above and those explained hereinafter. The optical fiber amplifier is provided with a stable amplification characteristic.

The optical fiber amplifier in accordance with the present invention further comprise a second multimode light generating module optically coupled to the other end portion of the erbium-doped optical fiber. This multimode light generating module can be configured to one of those as explained above and hereinafter. The second multimode light generating module provides an optical fiber amplifier with the enhanced optical output power (pumping light) for amplification in addition to the stable amplification characteristic.

The optical fiber amplifier in accordance with the present invention may further comprise a third multimode light generating module and optical multiplexing means. The optical multiplexing means is provided between the first and third multimode light generating modules and the erbium-doped optical fiber. The optical multiplexing means has an output and inputs. The inputs are optically coupled to the multimode light generating modules, respectively, whereas the output is provided so as to supply the multiplexed input light. The third multimode light generating module is optically coupled to one end portion of the erbium-doped optical fiber by way of the optical multiplexing means. The multimode light generating module can be configured to one of those as explained above and hereinafter.

More preferably, the multimode light generating module satisfies the relationship of $\lambda_{0.2}-\lambda_p$ less than 0.2 nm. If $\lambda_{0.2}-\lambda_p$ is 0.2 nm or greater, the optical output spectrum in the light-generating module may be broadened to such an extent that the insertion loss characteristic of the optical multiplexing means, such as an optical coupler, cannot be neglected.

The multimode light generating module may further comprise a housing containing the semiconductor optical amplification element and the light-receiving element therein. The optical fiber has first and second optical fiber portions. The second optical fiber portion is different from the first optical fiber portion. The first optical fiber portion is contained in the housing, whereas the second optical fiber portion is provided with a grating. According to the structure of the optical module, the length of the optical cavity is independent of the size of the housing.

Further scope of applicability of the present invention will be come apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

FIG. 7 is a diagram showing an optical coupling relationship in a multimode semiconductor laser section;

DESCRIPTION OF THE PREFERRED EMBODIMENTS

The above-mentioned object, other objects, features, and advantages of the present invention will be more fully understood from the following detailed descriptions of preferred embodiments of the present invention set forth with reference to the accompanying drawings.

The teaching of the present invention will easily be understood when the following detailed descriptions are taken into consideration with reference to the accompanying drawings illustrated byway of example. Embodiments of the present invention will now be explained with reference to the accompanying drawings. When possible, parts identical to each other will be referred to with the same numerals.

First Embodiment

Figure 1:
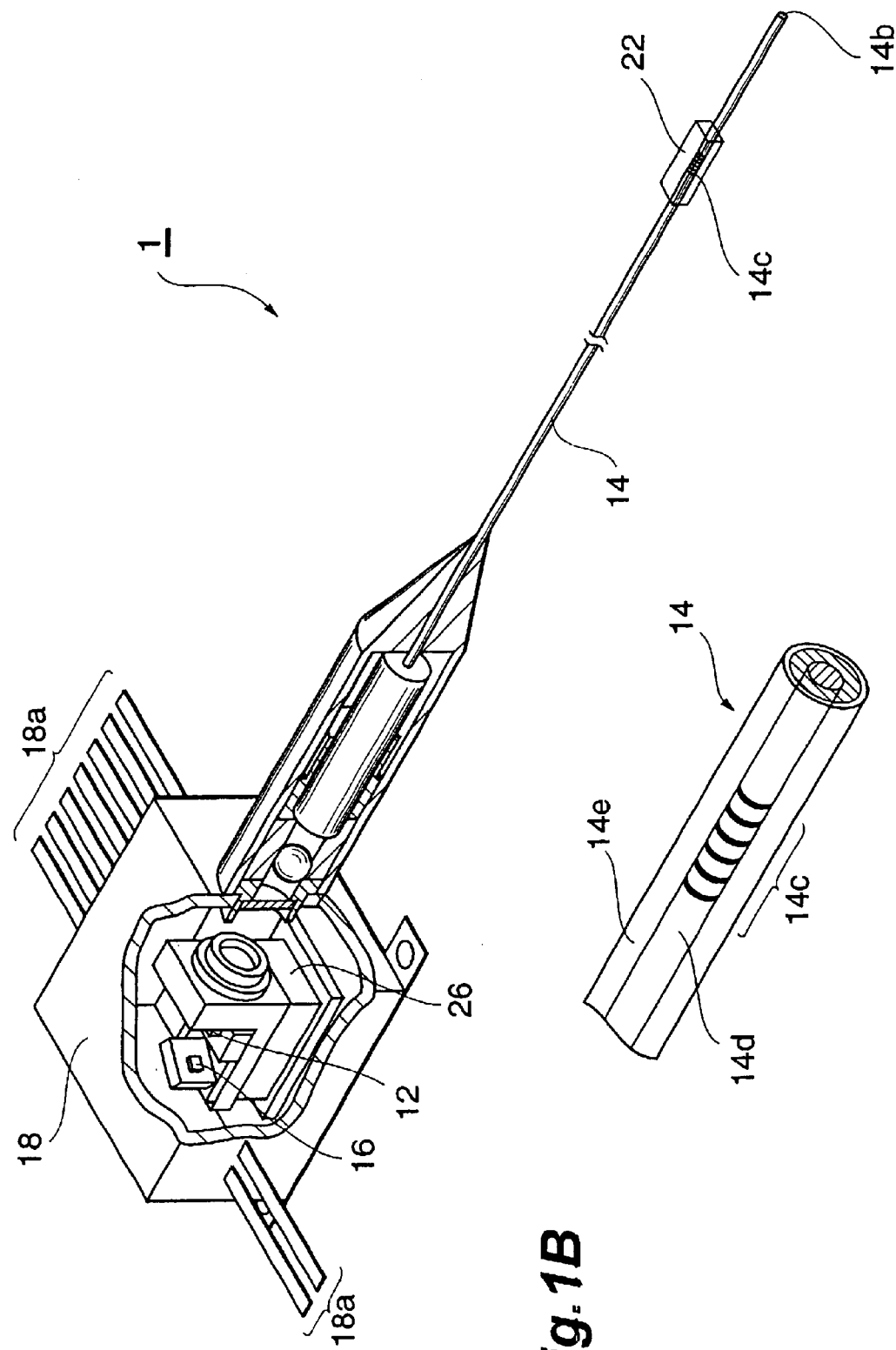
FIG. 1A is a perspective view showing a multimode light generating module.
FIG. 1B is a view showing a grating portion.
Figure 2:
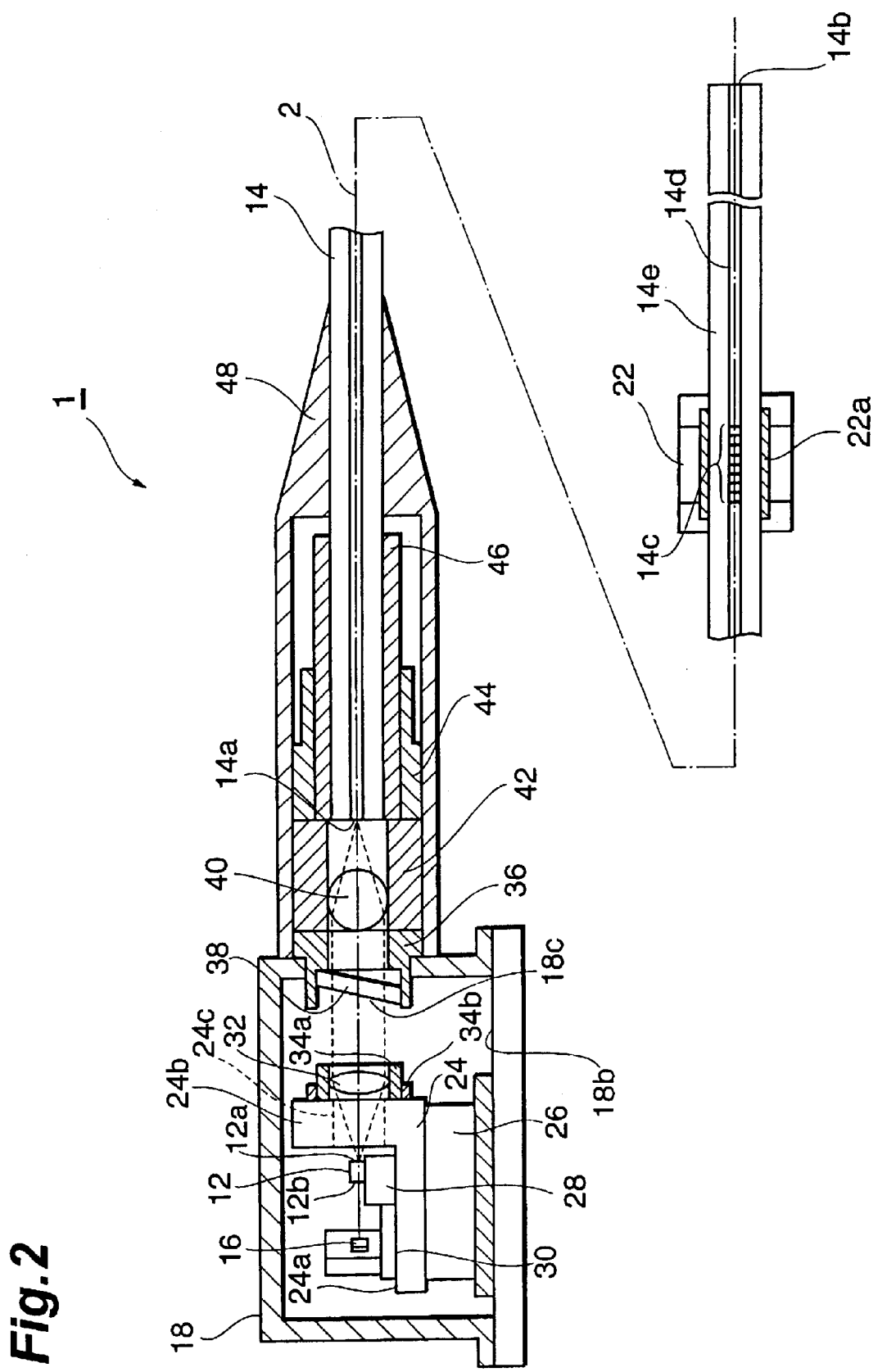
FIG. 2 is a cross sectional view showing the multimode light generating module.

With reference to FIGS. 1A and 2, the multimode light generating module in accordance with this embodiment will be explained. The multimode light generating module 1 comprises a semiconductor optical amplification element 12, an optical fiber 14, and a monitor light-receiving element 16. The monitor light-receiving element 16 is optically coupled to the semiconductor optical amplification element 12. One end portion of the optical fiber 14 is optically coupled to the semiconductor optical amplification element 12. The monitor light-receiving element 16 is optically coupled to the semiconductor optical amplification element 12. The light-generating module 1 further comprises a housing 18 for accommodating the semiconductor optical amplification element 12 and monitor light-receiving element 16. The housing 18 has a plurality of terminals electrically connected to the semiconductor optical amplification element 12, monitor light-receiving element 16, and Peltier element 26. The Peltier element 26 is utilized for controlling the temperature of the semiconductor optical amplification element 12 and monitor light-receiving element 16. The optical fiber 14 has a first optical fiber portion provided within the housing 18 and a second optical fiber portion provided outside the housing 18. The second optical fiber portion is provided with a grating 14c as shown in FIG. 1B. The grating 14c is disposed within a grating container 22.

With reference to FIG. 2, the light-generating module 1 will be explained in further detail. The semiconductor optical amplification element 12 has an active layer capable of converting electrical current into light in response to the carrier injection. Both ends of the active layer are provided with a light-reflecting face 12b and a light-emitting face 12a, respectively. The reflectivity of the light-reflecting face 12b is greater than that of the light-emitting face 12a. The optical fiber 13 has one end portion 14a, the other end portion 14b, and the grating 14c provided between one end portion 14a and the other end portion 14b. The optical fiber 14 includes a core part 14d and a cladding part 14e, whereas the grating 14c is provided in the core part 14d. The optical cavity of the light generating module 1 is constituted by the grating 14c and the light-reflecting face 12b of the semiconductor optical amplification element 12.

On the bottom face 18b within the housing 18, a mounting member 24 is provided by way of the Peltier element 26. On the mounting face 24a of the mounting member 24, mounting parts 28, 30, such as chip carriers, are disposed. The semiconductor optical amplification element 12 is mounted on the mounting part 28. The monitor light-receiving element 16 is mounted on the mounting part 30. A lens holding part 24b is disposed on the mounting face 24a of the mounting member 24. The lens holding part 24b is formed with a hole 24c extending in a direction of a predetermined axis 2. On a side wall face of the lens holding part 24b, positioning members 34a and 34b are disposed for holding a first lens 34. The positioning members 34a and 34b hold the first lens 32 so as to be optically coupled to the semiconductor optical amplification element 12.

One side wall in the housing 18 is provided with a light passing hole 18c extending in the direction of the axis 2. A first sleeve 36 is inserted in the light passing hole 18c. A hermetic glass 38 is disposed in the first sleeve 36 to hermetically seal the housing 18 therewith. Disposed at one end of the first sleeve 36 is a positioning member 42 for holding and positioning a second lens 40. The positioning member 42 positions the second lens 40 between the first lens 32 and one end portion 14a of the optical fiber 14 such that light from the semiconductor optical amplification element 12 is condensed at one end portion 14a of the optical fiber 14.

A second sleeve 44 is disposed at one end portion of the positioning member 42. A ferrule 46 is inserted in the second sleeve 44. The optical fiber 14 is inserted in the ferrule 46 so that one end of the optical fiber 14 is protected thereby. Each end portion of both the ferrule 46 and optical fiber 14 has a face inclined with respect to the predetermined axis 2.

In this embodiment, the grating 14c of the optical fiber 14 is provided within the grating container 22 separated from the housing 18, but the provision of the grating 14c is not limited thereto. The grating 14c is supported within the container 22 by a holding member 22a such as a ferrule.

As described above, the monitor light-receiving element 16, the semiconductor optical amplification element 12, the first lens 32, the second lens 40, one end portion 14a of the optical fiber 14, and the grating 14c are arranged along the predetermined axis 2. The first sleeve 36, the positioning member 42, the second sleeve 44, and the ferrule 46 are covered with a protecting member 48 such as a rubber cap.

Figure 3A:
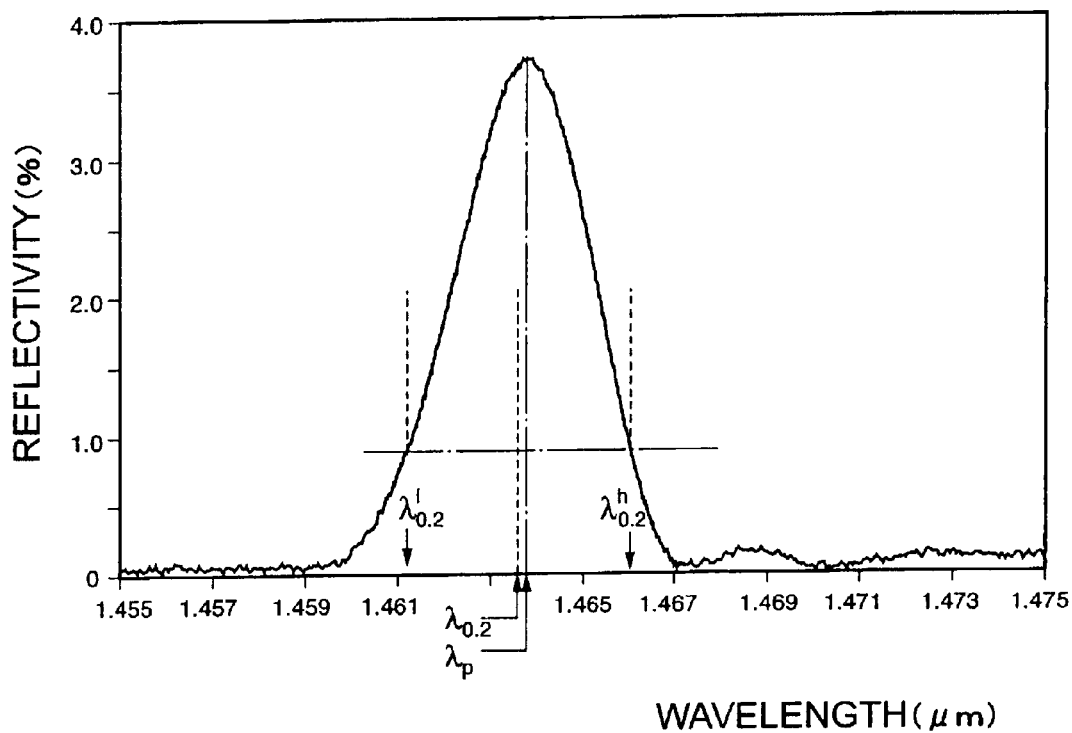
FIGS. 3A and 3B are charts showing characteristics of the reflection spectra of multimode light generating modules.
Figure 3B:
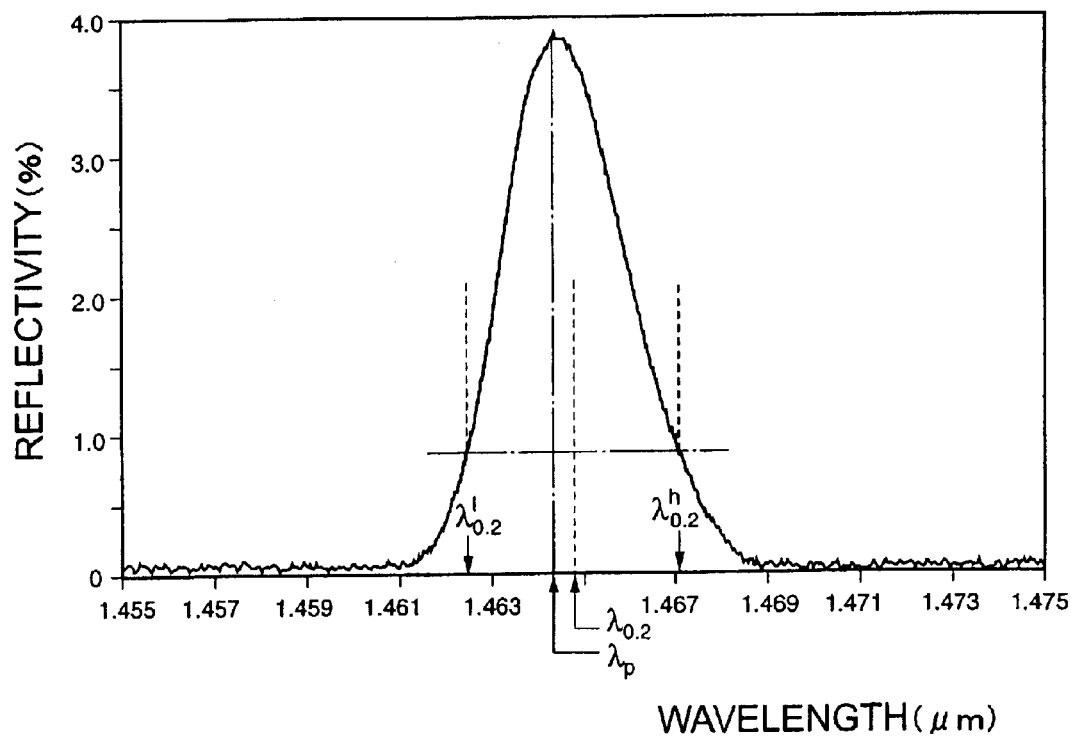

Referring to FIGS. 3A and 3B, reflection spectrum characteristics of gratings will be explained. FIG. 3A shows the reflection spectrum of a grating. In FIG. 3A, the average wavelength $(\lambda_{0.2}^{h}+\lambda_{0.2}^{l})/2$ is located in a wavelength region shorter than the peak wavelength $\lambda_p$. Therefore, in this reflection spectrum, the slope of the reflection spectrum in a shorter wavelength region with respect to the peak wavelength $\lambda_p$ is gentler than that in a longer wavelength region therewith. FIG. 3B shows the reflection spectrum of a grating. In FIG. 3B, the average wavelength of $(\lambda_{0.2}^{h}+\lambda_{0.2}^{l})/2$ is located in a longer wavelength region with respect to the peak wavelength $\lambda_p$. Therefore, in this reflection spectrum, the slope of the reflection spectrum in a longer wavelength region with respect to the peak wavelength $\lambda_p$ is gentler than that in the shorter wavelength region therewith. Namely, each of the respective reflection spectra shown in FIGS. 3A and 3B is asymmetrical. Here, $\lambda_{0.2}^{h}$ is the longer one of the two wavelengths exhibiting a relative reflectivity of 0.2 with respect to the maximum reflectivity, and $\lambda_{0.2}^{l}$ is the shorter wavelength thereof. It is thought that the relative reflectivity of 0.2 is appropriate to express the asymmetry of reflection spectra.

Figure 4:
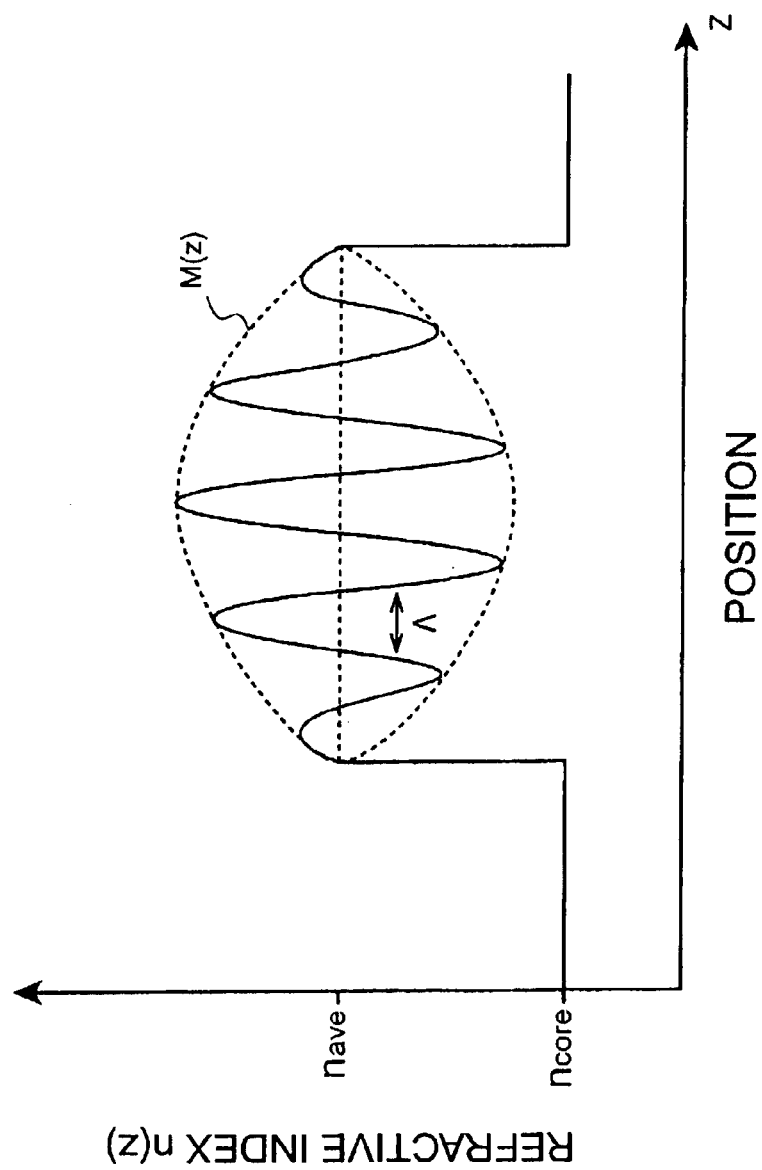
FIG. 4 is a chart showing a refractive index function n(z) of a grating.

These reflection spectra shown in FIGS. 3A and 3B are not realized by chirped gratings, the refractive index distribution of which change nonlinearly, but these reflection spectra are realized by grating shaving a periodic refractive index distribution of apodized type. FIG. 4 is a chart showing a refractive index distribution n(z) of one example of these gratings. When z axis is aligned with a predetermined axial direction, the refractive index distribution n(z) of a grating is expressed by $$n(z) = n_{core} + n_{ave} + M(z) \times \sin(2\pi z/\Lambda + \delta)$$

within the grating region, and by $$n(z) = n_{core}$$

in the outside of the grating region,
where
$n_{core}$ is a refractive index of the core;
$n_{ave}$ is an average refractive index of the grating region;
M(z) is a amplitude function;

$\Lambda$ is a period; and
$\delta$ is a phase.

Examples of functions employable as the amplitude function M(z) are listed as follows: Gaussian functions; and trigonometric functions. The multimode light generating module 1 may have a reflection spectrum exhibiting a half width half maximum not less than 2 nm and not more than 5 nm. If the half width half maximum is 2 nm and more, it is advantageous in that the occurrence of kinks is reduced in the monitor current characteristic. If the half width half maximum is 5 nm or less, it is advantageous in that the optical multiplexing means hardly lowers the optical output of the light-generating module. In the multimode light generating module 1, the reflection spectrum may have the maximum reflectivity of 5% or less. When the reflectivity is 5% or less, it is advantageous in that the oscillation light generated in the optical cavity is taken out through the optical fiber 14b.

Figure 5A:
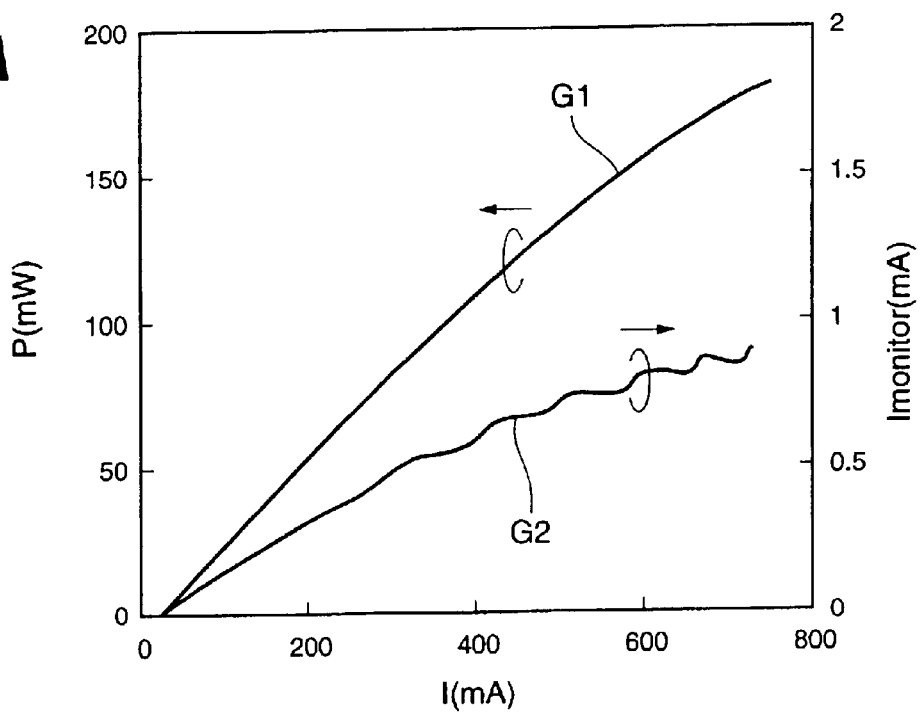
FIGS. 5A and 5B are charts showing characteristics of multimode light generating modules.
Figure 5B:
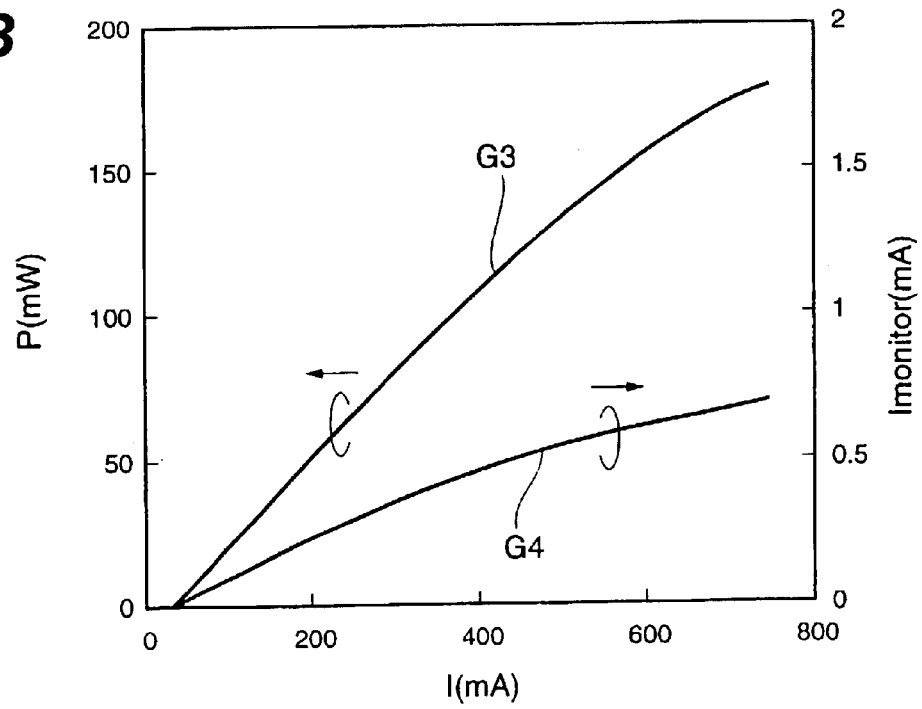

The inventors have prepared light-generating modules comprising various grating fibers having such reflection spectra. The optical outputs and monitor currents of these light-generating modules have been measured as a function of driving current. FIGS. 5A and 5B show illustrative measurements. In FIGS. 5A and 5B, the abscissa indicates the driving current I (mA) applied to a semiconductor optical amplification element in a multimode light generating module, the left ordinate indicates the optical output power P (mW) of the multimode light generating module, and the right ordinate indicates the monitor current $I_{monitor}$ (mA) of the photodiode in the multimode light generating module. These measurements have been carried out in multimode light generating modules having $\lambda_p$ in the wavelength band of 1.48 μm.

FIG. 5A shows a characteristic of a multimode light generating module having the reflection spectrum shown in FIG. 3A. As the driving current changes, the optical output curve G1 fluctuates in an undulating fashion. Clearly, the monitor current curve G2 fluctuates as well. FIG. 5B shows a characteristic of a multimode light generating module having the reflection spectrum shown in FIG. 3B. The fluctuation of monitor current curve G3 along with the change in driving current is smaller than that in FIG. 5A. Clearly, the fluctuation of monitor current G4 is smaller as well. Therefore, it is seen that the occurrence of kinks in the monitor current characteristic is reduced by the light generating module having a reflection spectrum that changes less drastically in the longer wavelength region than in the shorter wavelength region. This results in the reduction of fluctuations in the driving current applied to the semiconductor optical amplification element and based on the feedback, thereby reducing the occurrence of fluctuations in the oscillating longitudinal modes of laser oscillation and stabilizing the amount of the optical output power in the light generating module.

According to measurements carried out by the inventors in addition to those mentioned above, it has been found that the relationship of $$0.5 nm > \lambda_{0.2} - \lambda_p > 0.1 \ nm$$

is preferable. Here, $\lambda_{0.2}$ is defined by $\lambda_{0.2}^{h} - \lambda_{0.2}^{l}$. The inventors thinks that ripples may occurs in a reflection spectrum exhibiting $\lambda_{0.2} - \lambda_p$ of 0.5 nm or greater, and that this spectrum is not suitable for light-generating modules. If $\lambda_{0.2} - \lambda_p > 0.1$ nm, monitor current from the monitor light-receiving element become less sensitive to changes of the longitudinal laser oscillation mode in the semiconductor optical amplification element. Consequently, the occurrence of kinks is reduced in the monitor current characteristic as shown in FIG. 5B.

Figure 6A:
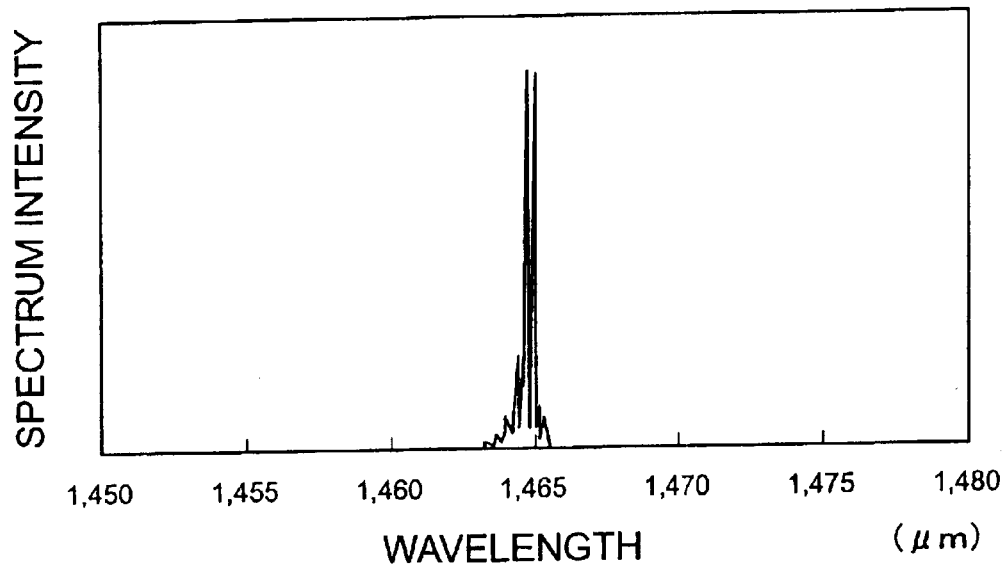
FIGS. 6A and 6B are charts showing oscillation spectrum characteristics of multimode light generating modules.
Figure 6B:
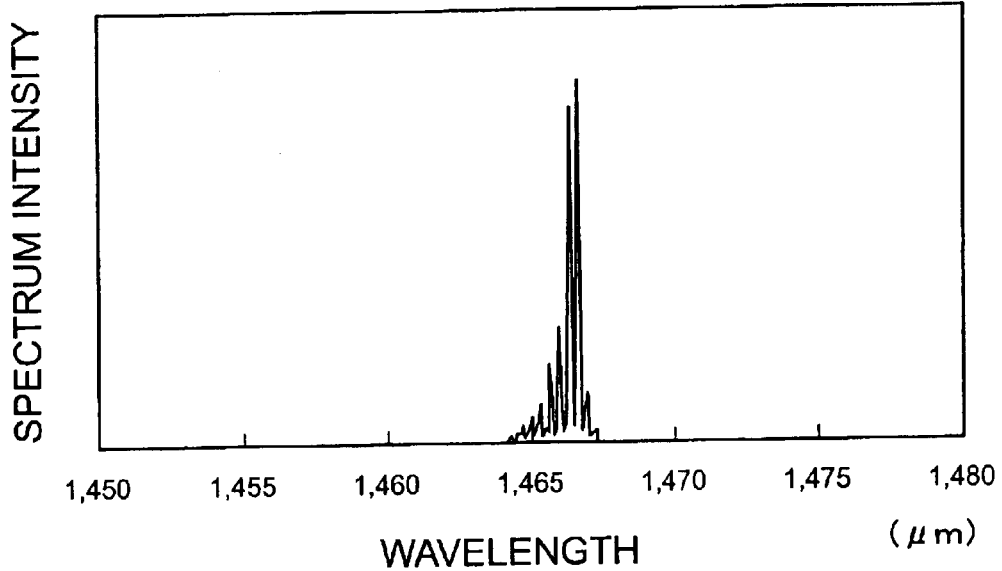

FIGS. 6A and 6B shows measurements of oscillation spectra. In each of FIGS. 6A and 6B, the abscissa indicates the wavelength λ ($\mu$m), whereas the ordinate indicates the intensity of oscillation spectrum (arbitrary unit). In FIG. 6A, the oscillation spectrum has a number of oscillating longitudinal modes, and some peaks in the oscillation spectrum exhibit relatively high intensities. If mode hopping occurs, kinks are apt to be caused in the monitor current. In FIG. 6B, the oscillation spectrum has a number of oscillating longitudinal modes having relatively similar intensities as compared with those in the oscillation spectrum of FIG. 6A. This oscillation spectrum reveals that the monitor current is less sensitive to the mode hopping and that kinks in the monitor current can be reduced. Hence, the light generating module can alleviate the influence of hopping between longitudinal modes on the optical output.

FIG. 7 shows an optical coupling relationship in a semiconductor laser section. The semiconductor laser section 50 comprises a light generating module 1 and a control means 52. The light generating module 1 comprises a semiconductor optical amplification element 12, an optical fiber 14, and a light-receiving element 16. The optical fiber 14 has a single grating 14c provided in its core 14d, whereas the grating 14c has a refractive index change with a predetermined period Λ and a modulated refractive index amplitude.

The semiconductor optical amplification element 12 comprises an active layer 12c having a light-emitting face 12a at one end thereof and a light-reflecting face 12b at the other end thereof. The light-emitting face 12a of the semiconductor optical amplification element 12 is optically coupled to the other end portion 14a of the optical fiber 14. The active layer 12c is provided between an n-type cladding semiconductor layer 12d and a p-type cladding semiconductor layer 12e. N-type electrode 12f is provided for the n-type cladding semiconductor layer 12d. P-type electrode 12g is provided for the p-type cladding semiconductor layer 12e.

The active layer 12c generates light in response to carriers injected thereto from the n-type cladding semiconductor layer 12d and p-type cladding semiconductor layer 12e. The generated light is directed toward the light-reflecting face 12b and light-emitting face 12a. Light A toward the light-emitting face 12a is transmitted through the light-emitting face 12a. Thus transmitted light B passes through lenses 22 and 40 to the optical fiber 14. In the optical fiber 14, apart of the transmitted light B is reflected by the grating 14c to form reflected light C. The remaining of the transmitted light becomes output light D provided from the other end 14b of the optical fiber 14. The reflected light C passes through one end portion 14a of the optical fiber 14, the lenses 22 and 40, and the light-emitting face 12a, to the active layer 12c. A part of light E toward the light-reflecting face 12b is reflected by the light-reflecting face 12b, whereas thus reflected light F is directed toward the light-emitting face 12a. These processes generate coherent light. The remaining of light G passes through the light-reflecting face 12b to the light-receiving element 16.

The light-receiving face 16a of the light-receiving element 16 is optically coupled to the light-reflecting face 12b of the semiconductor optical amplification element 12. For example, the light-receiving element 16 can be a photodiode, and the photodiode has a cathode 16b and an anode 16c.

A monitor current $I_{monitor}$ generated in the light-receiving element 16 is transmitted to the control means 52 by way of lines 54. The control means 52 provides the semiconductor optical amplification element 12 with a driving current $I_{drive}$ by way of line 56. The control means 52 is provided between the light-receiving element 16 and semiconductor optical amplification element 12 which are disposed in the multimode light generating module 1, and operates to feedback-control the driving current for the semiconductor optical amplification element 12 in response to electric signals from the light-receiving element 16. The control means 52 comprises a control circuit 52a having an input 52c and an output 52d, which operates to control the driving current to the semiconductor optical amplification element 12 such that the monitor current $I_{monitor}$ detected by the light-receiving element 16 approaches a predetermined value.

Since the semiconductor laser section 50 is feedback-controlled, changes in the monitor current $I_{monitor}$ are fed back to the semiconductor optical amplification element 12 by way of the control means 52. Namely, mode hopping changes the monitor current $I_{monitor}$, and this change is fed back to the semiconductor optical amplification element 12. It may be thought that this negative feedback causes unfavorable changes in the semiconductor laser apparatus 50. The light generating module 1 in accordance with this embodiment, however, is capable of reducing changes in monitor current $I_{monitor}$ caused by mode hopping.

In the multimode light generating module 1 in accordance with this embodiment, the grating 14c is provided at a position distanced from the housing end by about 55 cm to about 60 cm. Here, the physical length L of the cavity is in a range of 58 cm to 63 cm. In order to investigate the kink immunity of the multimode light generating module 1, values of the cavity length L are set shorter. The investigation reveals that the occurrence of kinks is kept on a par with that in the light generating module 1 of this embodiment even when the grating 14c is provided at a position distanced from the housing end by about 15 cm.

Here, the term, multimode, indicates that an emission spectrum of a light-generating module includes a plurality of oscillating wavelength components, located close to each other within a predetermined wavelength range, whose optical strengths are within 20 dB with respect to that of the maximum optical output wavelength of the emission spectrum.

Second Embodiment

Figure 8:
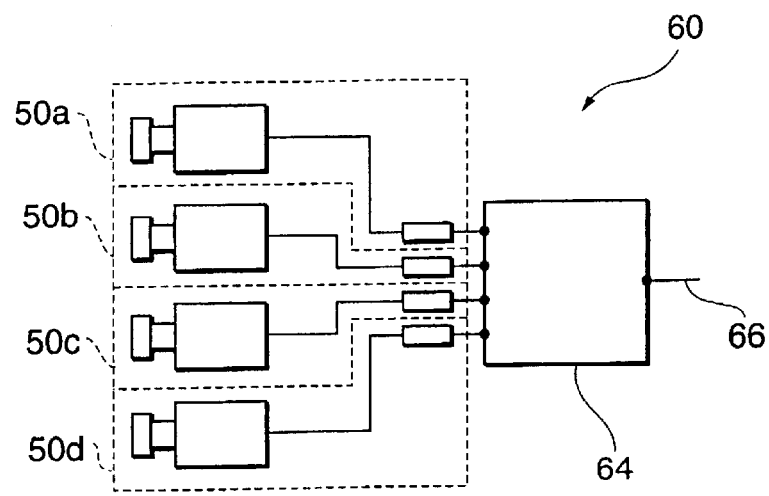
FIG. 8 is a diagram showing a semiconductor laser apparatus in accordance with another embodiment.

FIG. 8 shows a semiconductor laser apparatus 60. The semiconductor laser apparatus 60 comprises semiconductor laser sections 50a, 50b, 50c, 50d, and an optical multiplexing means 64. An example of the optical multiplexing means 64 may be an optical multiplexer, such as optical couplers, slab waveguide optical multiplexers and the like. The semiconductor laser sections 50a, 50b, 50c, 50d may be the semiconductor laser section 50 shown in FIG. 7, but are not limited thereto. The optical multiplexing means 64 has inputs optically coupled to respective outputs of the semiconductor laser sections 50a, 50b, 50c, 50d, and an output at which multiplexed light of input light components fed to these inputs is provided. Since the occurrence of kinks is reduced in each of the semiconductor laser sections 50a, 50b, 50c, 50d, unstable operations in the semiconductor laser apparatus 60 are hard to occur due to the kinks of the monitor current characteristic.

Third Embodiment

Figure 9:
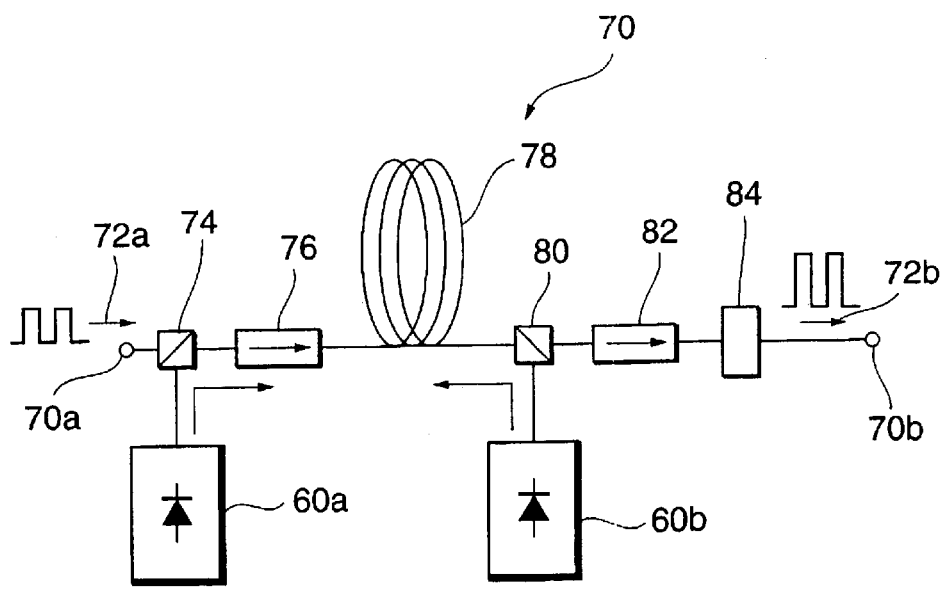
FIG. 9 is a diagram showing an optical fiber amplifier in accordance with another embodiment.

FIG. 9 shows an optical fiber amplifier 70. The optical fiber amplifier 70 has an input 70a and an output 70b. An input signal 72a is supplied to the input 70a, whereas the output 70b is provided with an amplified signal 72b. A first optical coupler 74, a first optical isolator 76, an erbium-doped optical fiber 78, a second optical isolator 82, and an optical filter 84 are provided between the input 70a and the output 70b. A semiconductor laser apparatus 60a is optically coupled to the first optical coupler 74. The first optical coupler 74 multiplexes the signal light 72a and pumping light supplied from the semiconductor laser apparatus 60a. The erbium-doped optical fiber 78 is provided with thus multiplexed light. The optical filter 84 is provided to reduce the leakage of the pumping light from the output.

A second optical coupler 80 can be further provided between the erbium-doped optical fiber 78 and the second optical isolator 82. A semiconductor laser apparatus 60b is optically coupled to the second optical coupler 80. The second optical coupler 80 serves to supply the pumping light from the semiconductor laser apparatus 60b to the optical fiber 78 in which the signal light 72b passes through. The pumping light is thus supplied to the optical fiber 78 through the second optical coupler 80. The first isolator 76 is provided to restrain the pumping light supplied from the semiconductor laser apparatus 60b from leaking out of the input. The second isolator 82 is provided to restrain noise light from flowing therein through the output.

By utilizing the pumping light, the erbium-doped optical fiber 78 amplifies signal light. In one configuration of optical fiber amplifiers, the pumping light may be supplied to one of end portions of the erbium-doped optical fiber 78. In another configuration of optical fiber amplifiers, The pumping light may be supplied to both of end portions of the erbium-doped optical fiber 78.

Fourth Embodiment

Figure 10:
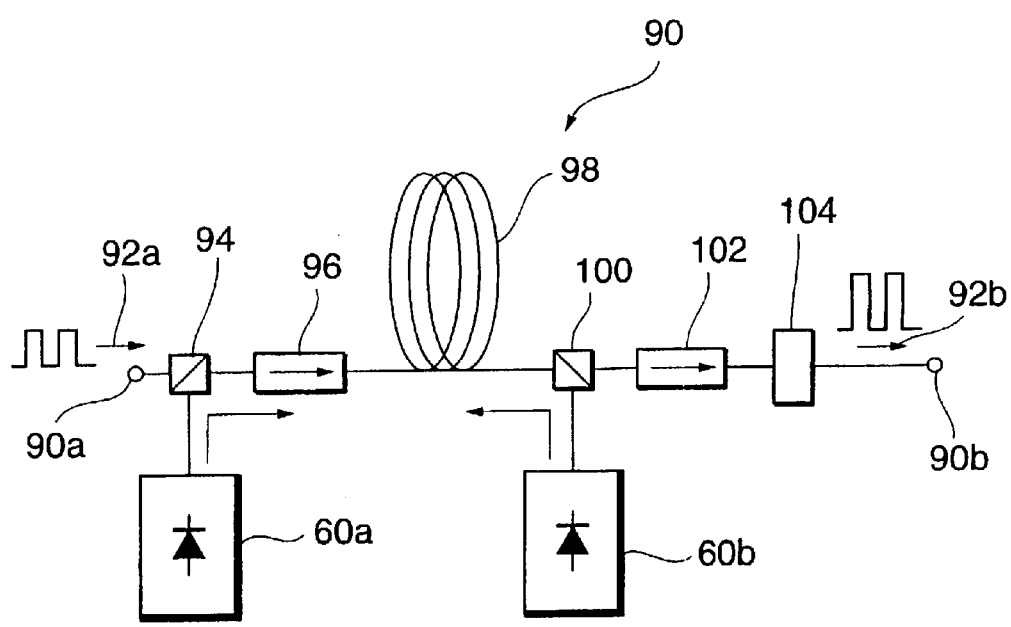
FIG. 10 is a diagram showing an optical fiber amplifier in accordance with still another embodiment.

FIG. 10 shows an optical fiber amplifier 90 for Raman amplification. The optical fiber amplifier 90 has an input 90a and an output 90b. An input signal 92a is supplied to the input 90a, whereas the output 90b is provided with an amplified signal 92b. A first optical coupler 94, a first optical isolator 96, an optical fiber 98 for Raman amplification, a second optical isolator 102, and an optical filter 84 are provided between the input 90a and the output 90b. A semiconductor laser apparatus 60a is optically coupled to the first optical coupler 94. The first optical coupler 94 multiplexes the signal light 92a and pumping light supplied from the semiconductor laser apparatus 60a. The Raman amplification optical fiber 78 is provided with thus multiplexed light. The optical filter 104 is provided so as to reduce the leakage of the pumping light from the output.

A second optical coupler 100 can be further provided between the Raman amplification optical fiber 98 and the second optical isolator 102. A semiconductor laser apparatus 60b is optically coupled to the second optical coupler 100. The second optical coupler 100 serves to supply the pumping light from the semiconductor laser apparatus 60b to the optical fiber 98 in which the signal light 92b passes through. The pumping light is thus supplied to the optical fiber 98 through the second optical coupler 100. The first isolator 96 is provided to restrain the pumping light supplied to the semiconductor laser apparatus 60b from leaking out of the input. The second isolator 102 is provided to restrain noise light from flowing therein through the output.

By utilizing the pumping light, the Raman amplification optical fiber 98 amplifies signal light. In one configuration of optical fiber amplifiers, the pumping light may be supplied to one of end portions of the Raman amplification optical fiber 98. In another configuration of optical fiber amplifiers, the pumping light may be supplied to both of end portions of the Raman amplification optical fiber 98.

As described above, Raman amplifiers in addition to erbium-doped optical fiber amplifiers are used for optical amplification. The Raman amplifiers may have the same configurations as or similar to those of the erbium-doped optical fiber amplifier. One type of the Raman amplifiers, a distribution constant type amplifier, uses an optical fiber for optical transmission as optical amplification medium. Another type thereof, a lumped parameter type amplifier, uses an optical fiber for optical amplification, such as a dispersion shifted fiber or a dispersion compensating fiber, each having a mode field diameter and relative refractive index difference lager than those of optical fibers used in the for optical transmission lines or erbium doped optical fiber.

In the multimode light generating module in accordance with the present invention, as explained in detail in the foregoing, the slope of the reflection spectrum in a longer wavelength region with respect to the peak wavelength $\lambda_p$ is gentler than that in the shorter wavelength region therewith. As a consequence, although the mode hopping still may occur, changes in the monitor current can be reduced. Therefore, the occurrence of kinks can be reduced in the monitor current characteristic.

Therefore, a multimode light generating module capable of reducing fluctuations in the monitor current is provided, and a semiconductor laser apparatus and optical fiber amplifier utilizing this multimode light generating module also are provided.

The principle of the present invention has been illustrated and described in the preferred embodiments thereof, and it is apparent to those skilled in the art that the present invention can be modified in arrangement and in detail without departing from the principle described above. For example, the present embodiments describe multimode light generating modules having $\lambda_p$ included in the wavelength band of 1.48 $\mu$m, but the present invention is not limited to this wavelength band but similarly applicable to other wavelength bands as well. From the invention thus described, it will be obvious that the embodiments of the invention may be varied in many ways. Such variations are not to be regarded as a departure from the spirit and scope of the invention, and all such modifications as would be obvious to one skilled in the art are intended for inclusion within the scope of the following claims.

What is claimed is:

1. A multimode light generating module comprising:
   an optical cavity constituted by a semiconductor optical amplification element having a pair of end faces, and an optical fiber including a grating having an apodized periodic refractive index distribution; and
   a monitor light-receiving element optically coupled to said optical cavity;
   wherein said grating has an asymmetric reflection spectrum having a relationship:

0.5 nm>$\lambda_{0.2}-\lambda_p$>0.1 nm where $\lambda_p$ is the wavelength exhibiting a maximum reflectivity, and $\lambda_{0.2}$ is defined by $(\lambda_{0.2}^h+\lambda_{0.2}^l)/2$ where $\lambda_{0.2}^h$ is a longer one of two wavelengths exhibiting a relative reflectivity of 0.2 with respect to said maximum reflectivity, and $\lambda_{0.2}^l$ is a shorter one of two wavelengths exhibiting a relative reflectivity of 0.2 with respect to said maximum reflectivity.

2. The multimode light generating module according to claim 1, wherein said reflection spectrum of said grating has a relationship:

0.2 nm>$\lambda_{0.2}-\lambda_p$>0.1 nm.

3. An optical fiber amplifier comprising:
   an erbium-doped optical fiber having one end portion and the other end portion;

a multimode light generating module according to claim 2, said multimode light generating module being optically coupled to one end portion of said erbium-doped optical fiber; and a circuit, provided between said light-receiving element and said semiconductor optical amplification element in said multimode light generating module, for feedback-controlling said semiconductor optical amplification element in response to an electric signal from said light-receiving element.

4. A Raman amplifier comprising:

a multimode light generating module according to claim 2;

an optical coupler having one input optically coupled to said multimode light generating module, said optical coupler having another input for receiving a signal light; and a circuit, provided between said light-receiving element and said semiconductor optical amplification element in said multimode light generating module, for feedback-controlling said semiconductor optical amplification element in response to an electric signal from said light-receiving element.

5. The Raman amplifier according to claim 4 further comprising an optical fiber for Raman amplification having one end portion coupled to said optical coupler.

6. A semiconductor laser apparatus for optical pumping, said semiconductor laser apparatus comprising:

a plurality of semiconductor laser sections, at least one of said multimode light generating sections including a multimode light generating module according to claim 2; and a circuit provided between said light-receiving element and said semiconductor optical amplification element provided in said multimode light generating module, said circuit being provided for controlling said semiconductor optical amplification element in response to an electric signal from said light-receiving element; and an optical multiplexer having a plurality of inputs and an output, said inputs being optically coupled to said semiconductor laser sections respectively, said output providing a multiplexing version of light from said semiconductor laser sections.

7. The multimode light generating module according to claim 1, further comprising a housing containing said semiconductor optical amplification element and said light-receiving element therein;

wherein said optical fiber has a first optical fiber portion contained in said housing and a second optical fiber portion different from said first optical fiber portion, said second optical fiber portion being provided with said grating.

8. An optical fiber amplifier comprising:

an erbium-doped optical fiber having one end portion and the other end portion;

a multimode light generating module according to claim 7, said multimode light generating module being optically coupled to one end portion of said erbium-doped optical fiber; and a circuit, provided between said light-receiving element and said semiconductor optical amplification element in said multimode light generating module, for feedback-controlling said semiconductor optical amplification element in response to an electric signal from said light-receiving element.

9. A Raman amplifier comprising:

a multimode light generating module according to claim 7;

an optical coupler having one input optically coupled to said multimode light generating module, said optical coupler having another input for receiving a signal light; and a circuit, provided between said light-receiving element and said semiconductor optical amplification element in said multimode light generating module, for feedback-controlling said semiconductor optical amplification element in response to an electric signal from said light-receiving element.

10. The Raman amplifier according to claim 9 further comprising an optical fiber for Raman amplification having one end portion coupled to said optical coupler.

11. A semiconductor laser apparatus for optical pumping, said semiconductor laser apparatus comprising:

a plurality of semiconductor laser sections, at least one of said multimode light generating sections including a multimode light generating module according to claim 7; and a circuit provided between said light-receiving element and said semiconductor optical amplification element provided in said multimode light generating module, said circuit being provided for controlling said semiconductor optical amplification element in response to an electric signal from said light-receiving element; and an optical multiplexer having a plurality of inputs and an output, said inputs being optically coupled to said semiconductor laser sections respectively, said output providing a multiplexing version of light from said semiconductor laser sections.

12. The multimode light generating module according to claim 1, wherein said $\lambda_p$ is in a wavelength band of 1.48 $\mu$m; and wherein said reflection spectrum has a half width half maximum in a range of 2 nm to 5 nm.

13. An optical fiber amplifier comprising:

an erbium-doped optical fiber having one end portion and the other end portion;

a multimode light generating module according to claim 12, said multimode light generating module being optically coupled to one end portion of said erbium-doped optical fiber; and a circuit, provided between said light-receiving element and said semiconductor optical amplification element in said multimode light generating module, for feedback-controlling said semiconductor optical amplification element in response to an electric signal from said light-receiving element.

14. A Raman amplifier comprising:

a multimode light generating module according to claim 12;

an optical coupler having one input optically coupled to said multimode light generating module, said optical coupler having another input for receiving a signal light; and a circuit, provided between said light-receiving element and said semiconductor optical amplification element in said multimode light generating module, for feedback-controlling said semiconductor optical amplification element in response to an electric signal from said light-receiving element.

15. The Raman amplifier according to claim 14 further comprising an optical fiber for Raman amplification having one end portion coupled to said optical coupler.

16. A semiconductor laser apparatus for optical pumping, said semiconductor laser apparatus comprising:

a plurality of semiconductor laser sections, at least one of said multimode light generating sections including a multimode light generating module according to claim 12; and a circuit provided between said light-receiving element and said semiconductor optical amplification element in said multimode light generating module, said circuit being provided for controlling said semiconductor optical amplification element in response to an electric signal from said light-receiving element; and an optical multiplexer having a plurality of inputs and an output, said inputs being optically coupled to said semiconductor laser sections respectively, said output providing a multiplexing version of light from said semiconductor laser sections.

17. A semiconductor laser apparatus for optical pumping, said semiconductor laser apparatus comprising:

a plurality of multimode light generating modules, at least one of said multimode light generating modules being according to claim 1;

means, provided between said light-receiving element and said semiconductor optical amplification element in each multimode light generating module, for controlling said semiconductor optical amplification element in response to an electric signal from said light-receiving element; and optical multiplexing means having a plurality of inputs and an output, said inputs being optically coupled to said multimode light generating modules respectively, said output providing a multiplexing version of light from said multimode light generating modules.

18. A semiconductor laser apparatus for optical pumping, said semiconductor laser apparatus comprising:

a plurality of semiconductor laser sections, at least one of said multimode light generating sections including a multimode light generating module according to claim 1; and a circuit provided between said light-receiving element and said semiconductor optical amplification element provided in said multimode light generating module, said circuit being provided for controlling said semiconductor optical amplification element in response to an electric signal from said light-receiving element; and an optical multiplexer having a plurality of inputs and an output, said inputs being optically coupled to said semiconductor laser sections respectively, said output providing a multiplexing version of light from said semiconductor laser sections.

19. An optical fiber amplifier comprising:

an erbium-doped optical fiber having one end portion and the other end portion; and a semiconductor laser apparatus according to claim 18, said semiconductor laser apparatus being optically coupled to one end portion of said erbium-doped optical fiber.

20. A Raman amplifier comprising:

a semiconductor laser apparatus according to claim 18; and an optical coupler having one input optically coupled to said multimode light generating module, said optical coupler having another input for receiving a signal light.

21. The Raman amplifier according to claim 20, further comprising an optical fiber for Raman amplification having one end portion coupled to said optical coupler.

22. An optical fiber amplifier comprising:

an erbium-doped optical fiber having one end portion and the other end portion;

a multimode light generating module according to claim 1, said multimode light generating module being optically coupled to one end portion of said erbium-doped optical fiber; and means, provided between said light-receiving element and said semiconductor optical amplification element in said multimode light generating module, for feedback-controlling said semiconductor optical amplification element in response to an electric signal from said light-receiving element.

23. An optical fiber amplifier comprising:

an erbium-doped optical fiber having one end portion and the other end portion;

a multimode light generating module according to claim 1, said multimode light generating module being optically coupled to one end portion of said erbium-doped optical fiber; and a circuit, provided between said light-receiving element and said semiconductor optical amplification element in said multimode light generating module, for feedback-controlling said semiconductor optical amplification element in response to an electric signal from said light-receiving element.

24. A Raman amplifier comprising:

a multimode light generating module according to claim 1;

an optical coupler having one input optically coupled to said multimode light generating module, said optical coupler having another input for receiving a signal light; and a circuit, provided between said light-receiving element and said semiconductor optical amplification element in said multimode light generating module, for feedback-controlling said semiconductor optical amplification element in response to an electric signal from said light-receiving element.

25. The Raman amplifier according to claim 24 further comprising an optical fiber for Raman amplification having one end portion coupled to said optical coupler.

* * * * *